United States Patent
Thaller

(10) Patent No.: US 8,248,157 B2
(45) Date of Patent: Aug. 21, 2012

(54) VARIABLE CAPACITANCE UNIT

(75) Inventor: Edwin Thaller, Faak am See (AT)

(73) Assignee: Infineon Technologies AG, Neubiberg (DE)

( * ) Notice: Subject to any disclaimer, the term of this patent is extended or adjusted under 35 U.S.C. 154(b) by 627 days.

(21) Appl. No.: 12/392,996

(22) Filed: Feb. 25, 2009

(65) Prior Publication Data

US 2010/0214715 A1     Aug. 26, 2010

(51) Int. Cl.
*H01L 29/93*     (2006.01)

(52) U.S. Cl. ............... 327/586; 455/169.2; 455/180.4

(58) Field of Classification Search ............... 327/586; 455/169.2, 180.4
See application file for complete search history.

(56) References Cited

U.S. PATENT DOCUMENTS

| | | | |
|---|---|---|---|
| 6,658,748 B1 | 12/2003 | Leipold et al. | |
| 6,791,422 B2 | 9/2004 | Staszewski et al. | |
| 7,675,373 B2 * | 3/2010 | Thaller | 331/57 |
| 2005/0231240 A1 * | 10/2005 | Goldfarb et al. | 327/105 |
| 2008/0297267 A1 * | 12/2008 | Thaller | 331/117 R |
| 2009/0091380 A1 * | 4/2009 | Min et al. | 327/586 |

OTHER PUBLICATIONS

Staszewski, et al., "Digitally Controlled Oscillator (DCO)-Based Architecture for RF Frequency Synthesis in a Deep-Submicrometer CMOS Process", IEEE Transactions on Circuits and Systems—II: Analog and Digital Signal Processing, vol. 50, No. 11, Nov. 2003, pp. 815-828.
Svelto, et al., "A 1.3 GHz Low-Phase Noise Fully Tunable CMOS LC-VCO", IEEE Journal on Solida State Circuits, vol. 35, No. 3, Mar. 2000, pp. 1-6.

* cited by examiner

*Primary Examiner* — John Poos
(74) *Attorney, Agent, or Firm* — SpryIP, LLC

(57) ABSTRACT

Implementations of differential variable capacitance systems are disclosed.

30 Claims, 12 Drawing Sheets

VARIABLE CAPACITANCE UNIT

BACKGROUND

Varactors and capacitors are commonly used in circuits such as voltage controlled oscillators (VCOs), digitally controlled oscillators (DCOs), low noise amplifiers (LNAs), or tunable filters for tuning the oscillation or resonance frequency of these circuits. In DCOs, varactors usually operate at either the maximum or minimum capacitance ($C_{max}$ or $C_{min}$). The capacitance difference between $C_{max}$ and $C_{min}$ values of the varactor determines the frequency step and resolution of the DCO.

The minimum value of the capacitance difference achievable with a single varactor is limited by the technology of the varactor, and is typically within the range of hundreds of attofarads (aF) for modern CMOS technologies. In some applications, the frequency deviation to the carrier during modulation requires frequency resolutions of below 1 kilohertz (kHz). This is smaller than 1 part-per-million (ppm) of oscillation frequency, which requires a capacitance difference of below 1 aF. It is therefore desirable to provide a varactor with improved resolution.

The minimum value of the capacitance achievable with a single capacitor is also limited by the technology of the capacitor, and is typically within the range of tens of femtofarads (fF) for modern CMOS technologies. In some applications, for instance for coarse oscillation frequency tuning of an oscillator, it would be desirable to have smaller capacitors for achieving higher coarse tuning frequency resolution.

DETAILED DESCRIPTION

A system comprising a variable capacitance unit is disclosed. The variable capacitance unit comprises at least first and second varactor components, wherein the first varactor component comprises at least one varactor with a first capacitance difference and the second varactor component comprises at least one varactor with a second capacitance difference. Control input terminals are provided for receiving control signals for activating and deactivating the varactor components. The system further includes at least one output signal corresponding to a total output capacitance C of the variable capacitance unit, wherein the difference in the total capacitance $\Delta C = (C_{max} - C_{min})$ of the variable capacitance unit is less than the first capacitance difference or the second capacitance difference. In at least one implementation, the first capacitance difference is expressed as $\Delta C1 = C_{1max} - C_{1min}$, and the second capacitance difference is expressed as $\Delta C2 = C_{2max} - C_{2min}$, wherein $C_{1max}$ and $C_{2max}$ are the maximum capacitances of the first and second varactor components respectively and $C_{1min}$ and $C_{2min}$ are the minimum capacitances of the first and second varactor components respectively. In at least one implementation, the total output capacitance difference $\Delta C$ of the variable capacitance unit is about $(C_{2max} + C_{1min}) - (C_{1max} + C_{2min})$.

Exemplary Environment

Figure 1:
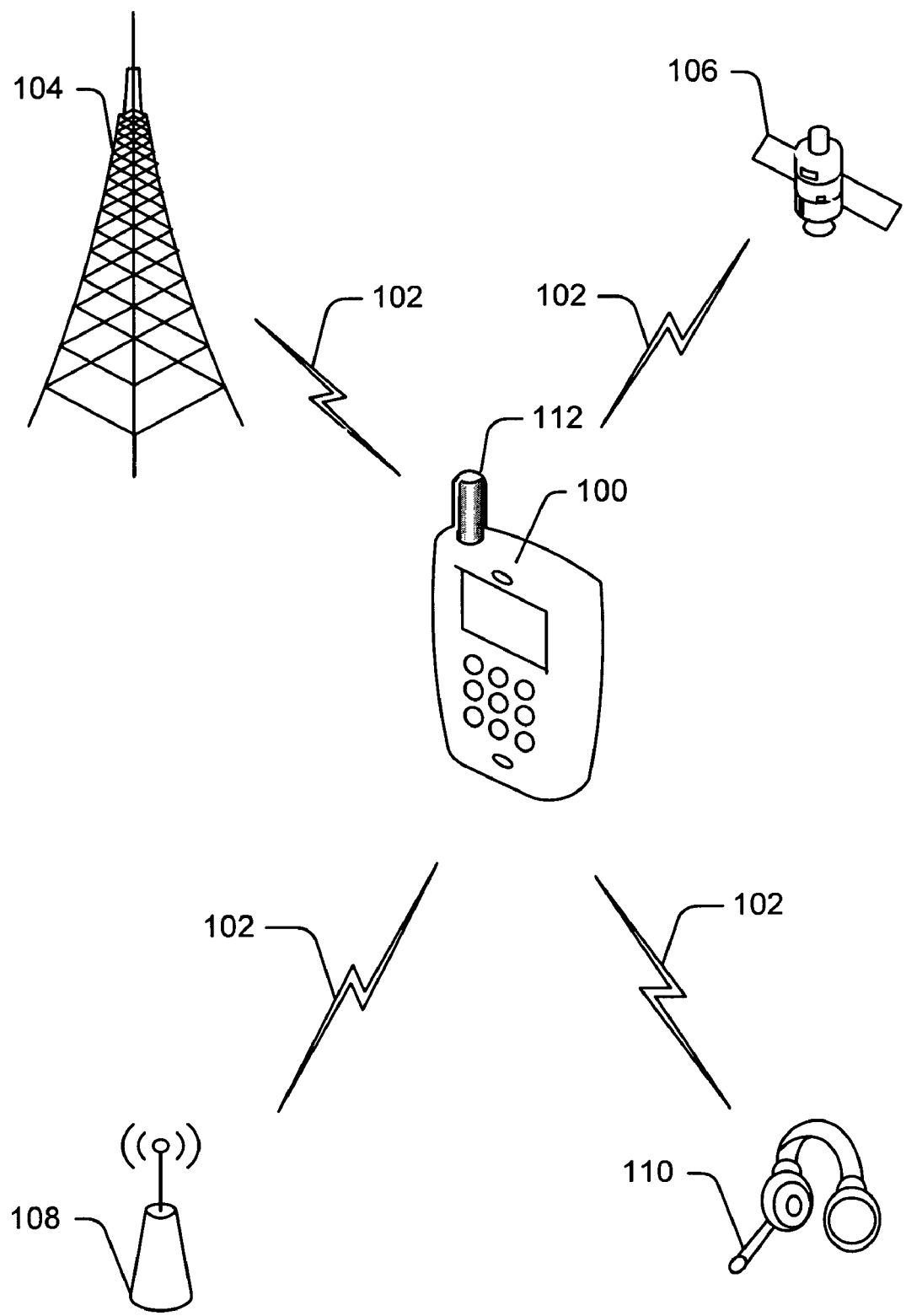
FIG. 1 shows an exemplary mobile device operable to wirelessly communicate with various communication devices.

FIG. 1 shows a wireless device 100 that is operable to send and receive signals 102 in multiple modes. The multiple modes, e.g., GSM, UMTS, and so forth, may be utilized for communication with communications points such as a base station 104, a satellite 106, a wireless access point (WAP) 108, Bluetooth (BT) headset 110, and/or other commutation devices through the use of wireless signals 102, which may be, for example, radio signals.

The wireless device 100 may be a cellular phone, wireless media device, or other device capable of receiving and/or transmitting a radio or other wireless signal 102. For example, the wireless device 100 may be a personal digital assistant (PDA), a portable computing device capable of wireless communication, a media player device, a portable gaming device, a personal computer, a wireless access point (WAP) and/or any other suitable device.

The wireless device 100 includes one or more antennas 112 that may be configured for communication with the base station 104, satellite 106, WAP 108, BT headset 110, and so forth. For example, the wireless device 100 may communicate using a GSM or UMTS mode with the base station 104 as part of a cellular network, in which the base station 104 represents a cellular phone tower or other device capable of transmitting and/or receiving one or more radio or other wireless signals 102 within a cell of a cellular network. The wireless device 100 may also communicate with the BT headset 110 using a BT mode for transmitting and receiving. The wireless device 100 may additionally or alternatively communicate with other communication points using the one or more antennas 112, which may be configured as a multiple-input multiple-output (MIMO), multiple-input single-output (MISO), and/or single-input multiple-output (SIMO) system to transmit and/or receive one or more signals 102 in one or more modes.

Exemplary Device

Figure 2:
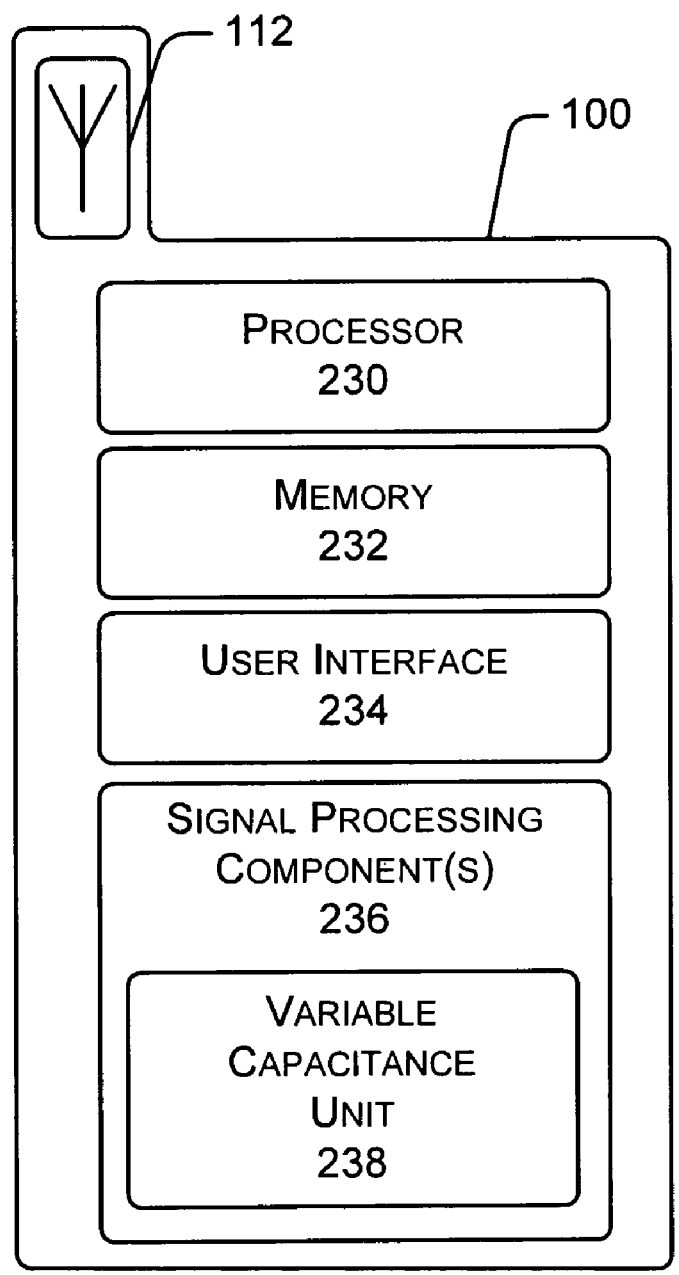
FIG. 2 shows a schematic representation of a wireless device.

FIG. 2 shows an exemplary device 100, including a variable capacitance unit 238. The wireless device 100 includes a processor 230, an antenna 234, memory 238, a user interface 239, and other components that not shown for the sake of simplicity, which receive, generate or otherwise process signals.

The signal processing components 236 process signals received from the processor 230, antenna 112, memory 232, user interface 234, and so forth. The signal processing components 236 may include a variable capacitance unit 238.

It will be appreciated by one skilled in the art that FIG. 2 is an exemplary schematic. Thus, certain details of the device 100, including the variable capacitance unit 238, have been omitted for simplicity of discussion.

Exemplary Variable Capacitance Unit

Figure 3:
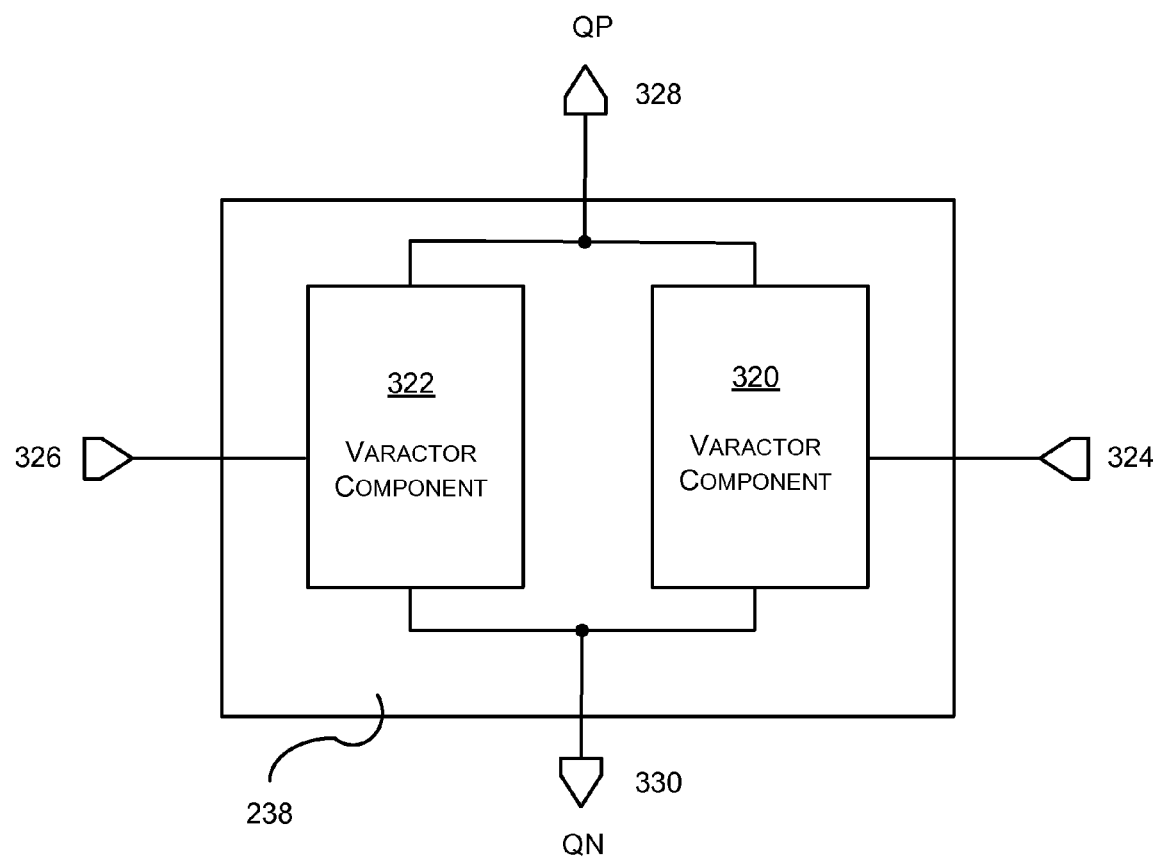
FIG. 3 shows an implementation of a variable capacitance unit.

FIG. 3 shows a variable capacitance unit 238. In one implementation, the variable capacitance unit 238 is a differential variable capacitance unit. The variable capacitance unit 238 may include a plurality of differentially coupled varactor components. Illustratively, the variable capacitance unit comprises first and second differentially coupled varactor components 320 and 322. Providing other number of varactor components is also useful. The varactor components may include CMOS varactors or other types of devices capable of providing variable capacitance.

In one implementation, the variable capacitance unit 238 comprises first and second control terminals 324 and 326. The first control terminal 324 is coupled to the first varactor component 320 and the second control terminal 326 is coupled to the second varactor component 322. The control terminals (324 and 326) are configured to receive control signals for activating or deactivating the respective varactor components (320 and 322). An active signal at the control terminal activates (or selects) the respective varactor component while an inactive signal at the control terminal deactivates (or deselects) the respective varactor component. The active signal, for example, can be logic low, logic high or a combination thereof.

In one implementation, only one of the varactor components is activated at any one time. For example, the first varactor component 320 is activated while the second varactor 322 component is deactivated or vice-versa. In such applications, a single input signal may be provided to the varactor components (320 and 322). For example, an input signal can be used for one of the varactor components while an inverted input signal can be used for the other one. Alternatively, distinct input signals may also be provided.

In one implementation, the variable capacitance unit 238 further comprises first and second output terminals (328 and 330) coupled to the first and second varactor components (320 and 322). The variable capacitance unit is operable to provide a total capacitance C at the first and second output terminals (328 and 330). First output terminal 328 may be the positive terminal (Qp), while second output terminal 330 may be the negative terminal (Qn) of the variable capacitance unit.

The total capacitance (C) of the variable capacitance unit may be determined by the capacitance values of first and second varactor components (320 and 322). The first varactor component 320 may include first maximum and minimum capacitances ($C_{1max}$ and $C_{1min}$) and second varactor component 340 may comprise second maximum and minimum capacitances ($C_{2max}$ and $C_{2min}$). The varactor components may include different maximum and minimum capacitances. For example, $C_{1max} \neq C_{2max} \neq C_{1mim} \neq C_{2min}$. In one implementation, $C_{2max}$ is greater than $C_{1max}$ and $C_{2min}$ is greater than $C_{1min}$. For example, the capacitance difference $\Delta C2 = C_{2max} - C_{2min}$ of the second varactor component 322 is greater than the capacitance difference $\Delta C1 = C_{1max} - C_{1min}$ of the first varactor component 320. Other configurations of the varactor components are also useful.

The variable capacitance unit 238 may be operable to provide a minimum and maximum capacitance ($C_{min}$ and $C_{max}$) at first and second output terminals (328 and 330). To obtain the higher capacitance value $C_{max}$, the second varactor component 322 may be turned on and the first varactor component 320 may be turned off. On the other hand, the low capacitance value $C_{min}$ may be obtained by turning on the first varactor component 320 and turning off the second varactor component 322. The input signals at input terminals (324 and 326) may be used turn on or off the respective varactor components, and thereby select the value of the capacitance (either $C_{min}$ or $C_{max}$) presented at the output terminals (328 and 330).

The difference ($\Delta C$) between the maximum capacitance ($C_{max}$) and the minimum capacitance ($C_{min}$) of the variable capacitance unit 238 may be equal to about ($C_{2max} + C_{1mim}$) − ($C_{1max} + C_{2min}$). In the case where the first varactor component 320 is selected, the output signal $C_{min}$ may be equal to about $C_{1max} + C_{2min}$ and in the case where the second varactor component 322 is selected, the output signal $C_{max}$ is equal to about $C_{2max} + C_{1min}$. By using at least 2 varactor components to provide the total capacitance at the output terminals, the variable capacitance unit may advantageously achieve a very low capacitance difference (e.g., $\Delta C < 1$ aF), thereby improving, for example, the frequency resolution for oscillator circuits.

Figure 4:
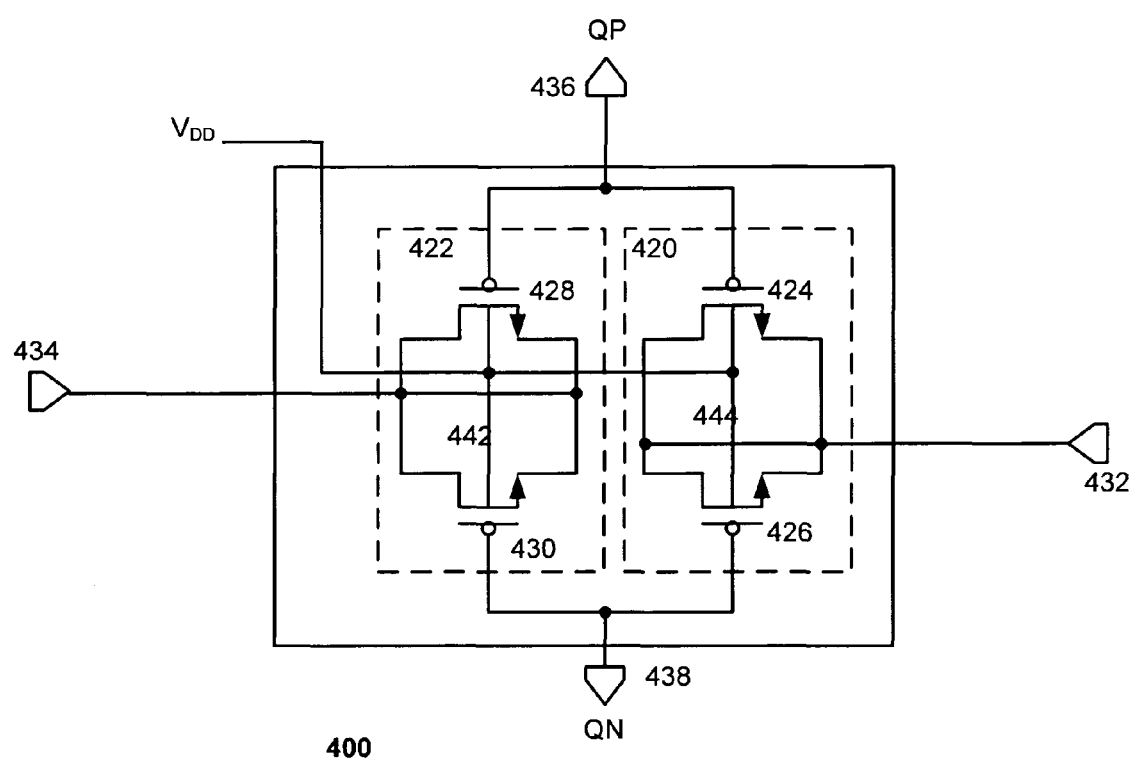
FIG. 4 shows another implementation of a variable capacitance unit.

FIG. 4 shows an implementation of a differential variable capacitance unit 400. As shown, the variable capacitance unit 400 comprises first and second differentially coupled varactor components (420 and 422). More than two varactor components may also be employed. The varactor components may comprise CMOS varactors or other types of varactors.

In one implementation, the first varactor component 420 comprises a first varactor 424 and a second varactor 426. The second varactor component 422 also comprises a first varactor 428 and a second varactor 430. Although only P-type varactors are shown, N-type varactors may also be used. Other types of varactor components or varactors may also be used. The varactors (424, 426, 428, and 430) may each be of a different size in order to tailor the capacitance difference of the varactors.

The first and second varactors (e.g., 424 and 426; 428 and 430; etc.) have commonly coupled source terminals and drain terminals, respectively. In one implementation, the bulk terminals of the varactors are coupled to a source voltage $V_{DD}$. Source and drain terminals of the varactors (424 and 426) of the first varactor component 420 are coupled to a first control input terminal 432; source and drain terminals of the varactors (428 and 430) of the second varactor component 422 are coupled to a second control input terminal 434. The bulk terminals could also be connected to a source voltage $V_{SS}$ or connected to the drain and source terminals of the respective varactor components.

In one implementation, first and second output terminals 436 and 438 are provided. The first output terminal 436 may be a positive terminal (QP), while the second output terminal 438 may be a negative terminal (QN). First output terminal 436 is coupled to the gate terminals of the first varactors (424 and 428) of the varactor components (420 and 422) and the second output terminal 438 is coupled to the gate terminals of the second varactors (426 and 430) of the varactor components (420 and 422). The control terminals (432 and 434) are configured to receive control signals for activating or deactivating the varactor components (420 and 422). An active signal at the control terminal activates the respective varactor component while an inactive signal at the control terminal deactivates the respective varactor component. The active signals, for example, can be logic low, logic high or a combination thereof.

In one implementation, only one of the varactor components may be activated at any one time. For example, the first varactor component is activated while the second varactor component is inactivated or vice-versa. In such applications, a single input signal may be provided to the varactor components, with one being inverted or while the other is un-inverted.

According to one implementation, the first varactor component comprises a first maximum and minimum capacitance ($C_{1max}$ and $C_{1min}$) and the second varactor component comprises a second maximum and minimum capacitance ($C_{2max}$ and $C_{2min}$). In this implementation, $C_{2max}$ is greater than $C_{1max}$ and $C_{2min}$ is greater than $C_{1min}$. Other configurations of the varactor components are also useful. When the second varactor component is selected, the capacitance is equal to $C_{2max}+C_{1min}$. The capacitance is equal to $C_{1max}+C_{2min}$ when the first varactor component is selected.

The $C_{max}$ and $C_{min}$ of a varactor can be adjusted by selecting the desired dimensions, for example, length (L) and width (W) of the varactor. The granularity of the dimensions of a single varactor may be limited by the technology or ground rule used. For example, the granularity is in the range of 5 nm in the case of 65 nm technology and in the range of 1 nm for the case of 32 nm technology.

Figure 5A:
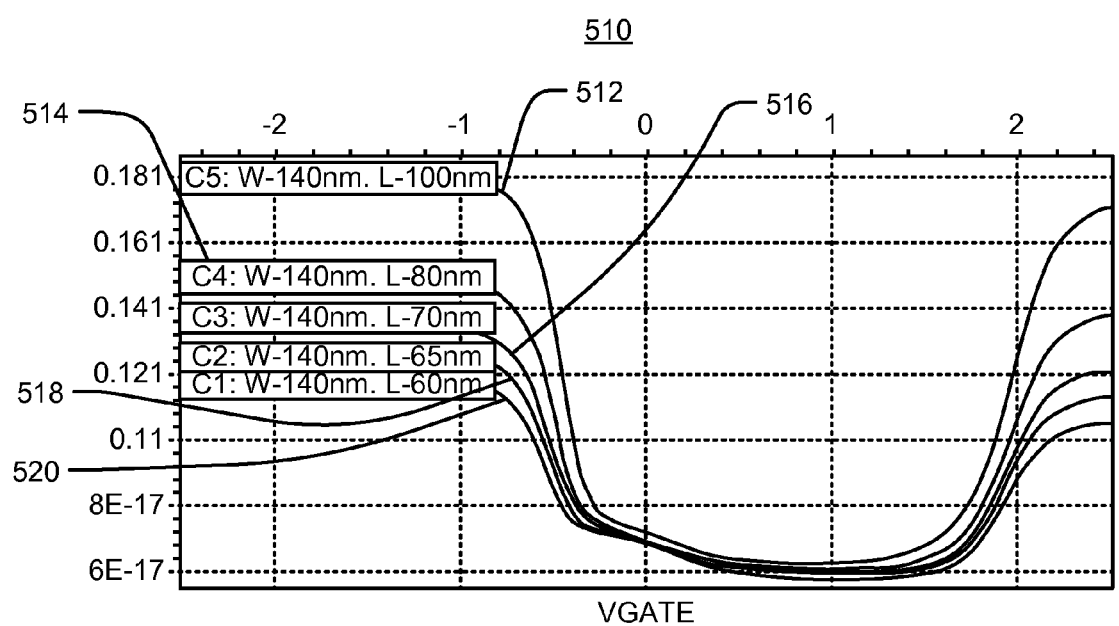
FIGS. 5*a-b* show capacitance-voltage (CV) curves of different varactors and variable capacitance units.

FIG. 5a shows an exemplary plot 510 of capacitance-voltage (CV) curves of single varactors or varactor components having a fixed or constant width with varying lengths. The width of the varactors is 140 nm. Five varactors with fixed width of 140 nm and varying lengths are measured. Varactor C5 has a length 100 nm, varactor C4 has a length of 80 nm, varactor C3 has a length 70 nm, varactor C2 has a length 65 nm and varactor C1 has a length 60 nm.

Curve 512 corresponds to a varactor C5, curve 514 corresponds to a varactor C4, curve 516 corresponds to a varactor C3, curve 518 corresponds to varactor C2 and curve 520 corresponds to a varactor C1. As shown, an increase in the length results in an increase in capacitance difference ($C_{max}-C_{min}$). Similarly, an increase in width while keeping the length constant would also result in an increase the $C_{max}-C_{min}$. According to the example shown, the smallest $C_{max}-C_{min}$ for a single varactor is about 64 aF for a width of 140 nm and a length of 60 nm while the largest capacitance difference is about 123 aF for a width of 140 nm and a length of 100 nm.

Figure 5B:
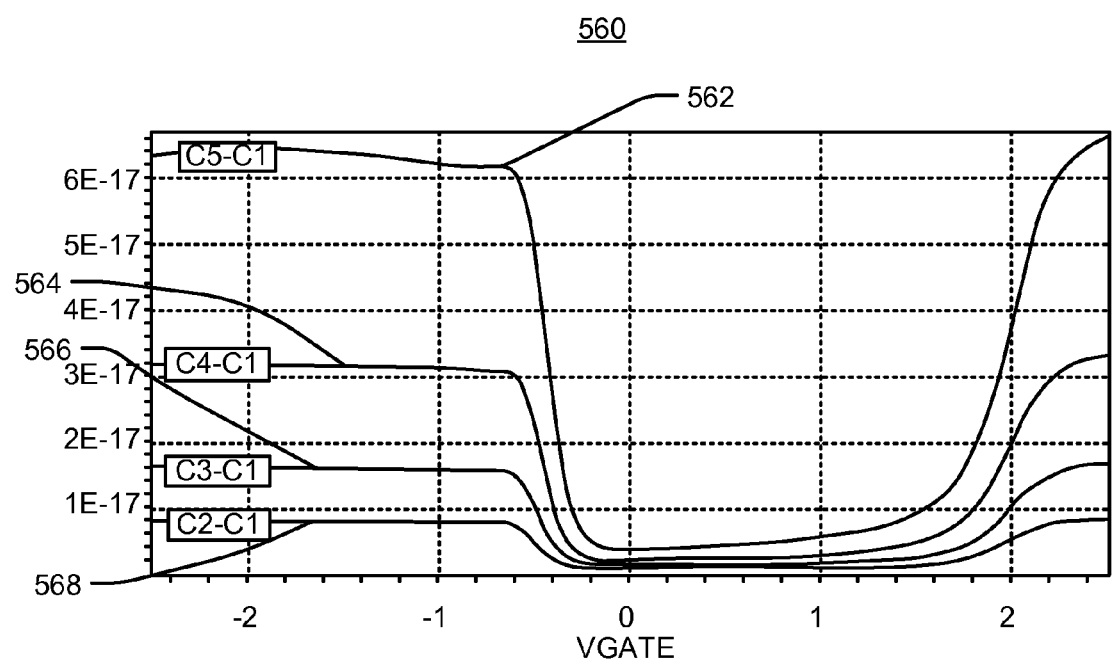

FIG. 5b shows a plot 560 of CV curves of differential variable capacitance units having varactor C1 in combination with the one of the other varactors (C2, C3, C4 or C5). Curve 562 corresponds to a variable capacitance unit with C5 and C1, curve 564 corresponds to a varactor with C4 and C1, curve 566 corresponds to a varactor with C3 and C1 and curve 568 corresponds to varactor with C2 and C1. As shown, variable capacitance unit with C2 and C1 have the smallest capacitance difference ($C_{max}-C_{min}$) of about 8 aF. This is about 8 times smaller than the smallest $C_{max}-C_{min}$ of C1 in FIG. 5a. Increasing the resolution of $C_{max}-C_{min}$ can result in significant advantages. For example, in the case of a digitally-controlled oscillator (DCO) with a $\Delta\Sigma$-modulator that is modulating the Least-Significant-Bit varactors, this effect increases the frequency resolution of the DCO by 3 bits or in other words a factor of 8. This advantageously leads to a significant reduction of power or makes it possible to achieve the desired frequency resolution.

Figure 6:
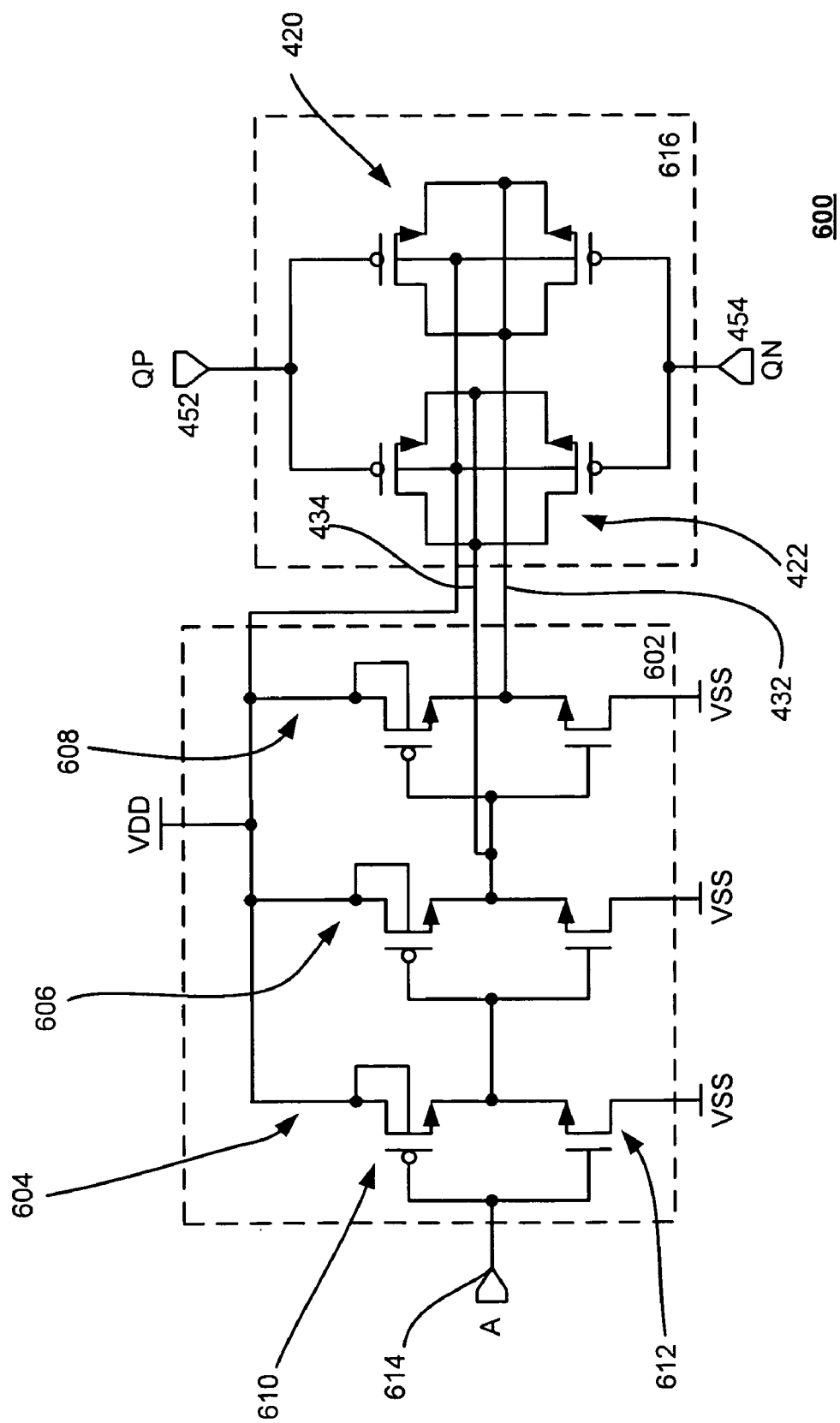
FIG. 6 shows an implementation of a varactor cell.

FIG. 6 shows an implementation of a varactor cell 600. The varactor cell may be employed in, for example, a primary circuit such as a DCO. Incorporating the varactor cell in other types of primary circuits, such as a voltage-controlled circuit (VCO), low noise amplifier (LNA) or tunable filters for tuning the oscillation or resonance frequency of these circuits, is also useful. As shown, the varactor cell comprises a switching circuit 602 coupled to a variable capacitance unit 616.

Switching circuit 602 includes a plurality of inverters coupled in series. In one implementation, the switching circuit 602 comprises a first inverter 604, a second inverter 606, and a third inverter 608 coupled in series. Each inverter comprises a pull up transistor 610 and a pull down transistor 612. The source terminal of the pull up transistor 610 is coupled to a first power supply $V_{DD}$. The drain terminal of the pull up transistor 610 is coupled to the drain terminal of the pull down transistor 612. The source terminal of the pull down transistor 612 is coupled to a second power supply $V_{SS}$. The gate terminals of the pull up transistor 610 and pull down transistor 612 are commonly coupled.

A control input terminal 614 is provided to the varactor cell 600. The control input terminal 614 is coupled to the input of the first inverter 604. For example, the control input terminal is coupled to the gates of the transistors of the first inverter 604 of the switching circuit 602. The control input terminal 614 receives a mode signal A. The mode signal A, for example, determines whether the first or second varactor component (420 or 422) is activated. The mode signal comprises, for example, a bit of an oscillator tuning word. Other types of control signals may also be used.

The inverters are coupled in series. In one implementation, the output terminal of the first inverter 604 is coupled to the input terminal of the second inverter 606 and the output terminal of the second inverter 606 is coupled to the input terminal of the third inverter 608. The second and third inverter output terminals are also coupled to the variable capacitance unit 616. In one implementation, the third inverter output terminal is coupled to the second varactor cell control terminal 434 while the second inverter output terminal is coupled to the first varactor cell control terminal 432. The truth table of the circuit is shown in Table 1.

TABLE 1

| Signal A | First varactor component | Second varactor component |
| --- | --- | --- |
| 0 | Selected | Unselected |
| 1 | Unselected | Selected |

In one implementation, the first varactor component comprises a first maximum and minimum capacitance ($C_{1max}$ and $C_{1min}$) and the second varactor component comprises a second maximum and minimum capacitance ($C_{2max}$ and $C_{2min}$). In one implementation, $C_{2max}$ is greater than $C_{1max}$ and $C_{2min}$ is greater than $C_{1min}$. Other configurations of the varactor components are also useful. When the second varactor component is selected, the capacitance is equal to $C_{2max}+C_{1min}$. The capacitance is equal to $C_{1max}+C_{2min}$ when the first varactor component is selected. The output terminals (452 and 454) of the varactor cell are, for example, coupled to input terminals of a DCO.

Exemplary Method

Figure 7:
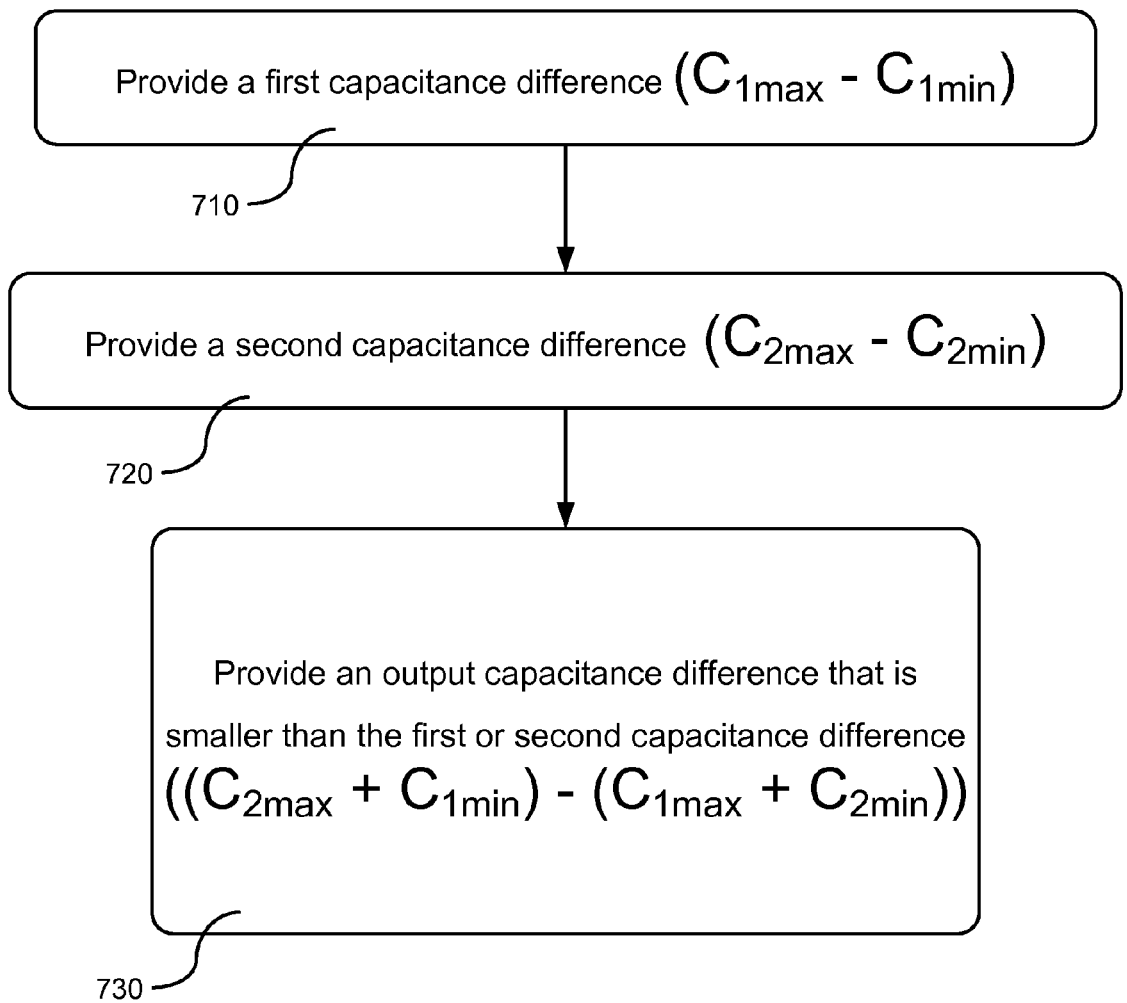
FIG. 7 shows an exemplary method of providing variable capacitance.

FIG. 7 is a flow chart showing an exemplary method 700 of providing variable capacitance. The method may be implemented using the exemplary variable capacitance unit (238 or 400) described above with reference to FIGS. 2 through 6. In one implementation, the variable capacitance unit comprises a first varactor component coupled to a second varactor component. The specifics of the exemplary method are described below. However, it should be understood that certain acts need not be performed in the order described, and may be modified, and/or may be omitted entirely, depending on the circumstances.

At 710, a first capacitance difference is provided. The first capacitance difference may be provided by a first varactor component having a maximum capacitance $C_{1max}$ and a minimum capacitance $C_{1min}$. The first capacitance difference may be expressed by $\Delta C1 = C_{1max} - C_{1min}$.

At 720, a second capacitance difference is provided. The second capacitance difference may be provided by a second varactor component having a maximum capacitance $C_{2max}$ and a minimum capacitance $C_{2min}$. The second capacitance difference may be expressed by $\Delta C2 = C_{2max} - C_{2min}$. In one implementation, $C_{2max}$ is greater than $C_{1max}$ and $C_{2min}$ is greater than $C_{1min}$. For example, the second capacitance difference $\Delta C2 = C_{2max} - C_{2min}$ of the second varactor component is greater than the first capacitance difference $\Delta C1=C_{1max}-C_{1min}$ of the first varactor component.

At 730, an output capacitance difference smaller than the first or the second capacitance difference is provided by the variable capacitance unit. The output capacitance (C) may be determined by the capacitance values of first and second varactor components. For example, the difference ($\Delta C$) between the maximum output capacitance ($C_{max}$) and the minimum output capacitance ($C_{min}$) may be equal to about $(C_{2max}+C_{1mim})-(C_{1max}+C_{2min})$. The method may further include receiving a mode signal A to select an output signal corresponding to either the maximum output capacitance ($C_{max}=C_{2max}+C_{1mim}$) or the minimum output capacitance ($C_{min}=C_{1max}+C_{2min}$).

Exemplary DCO and Alternative Exemplary Variable Capacitance Unit

Figure 8:
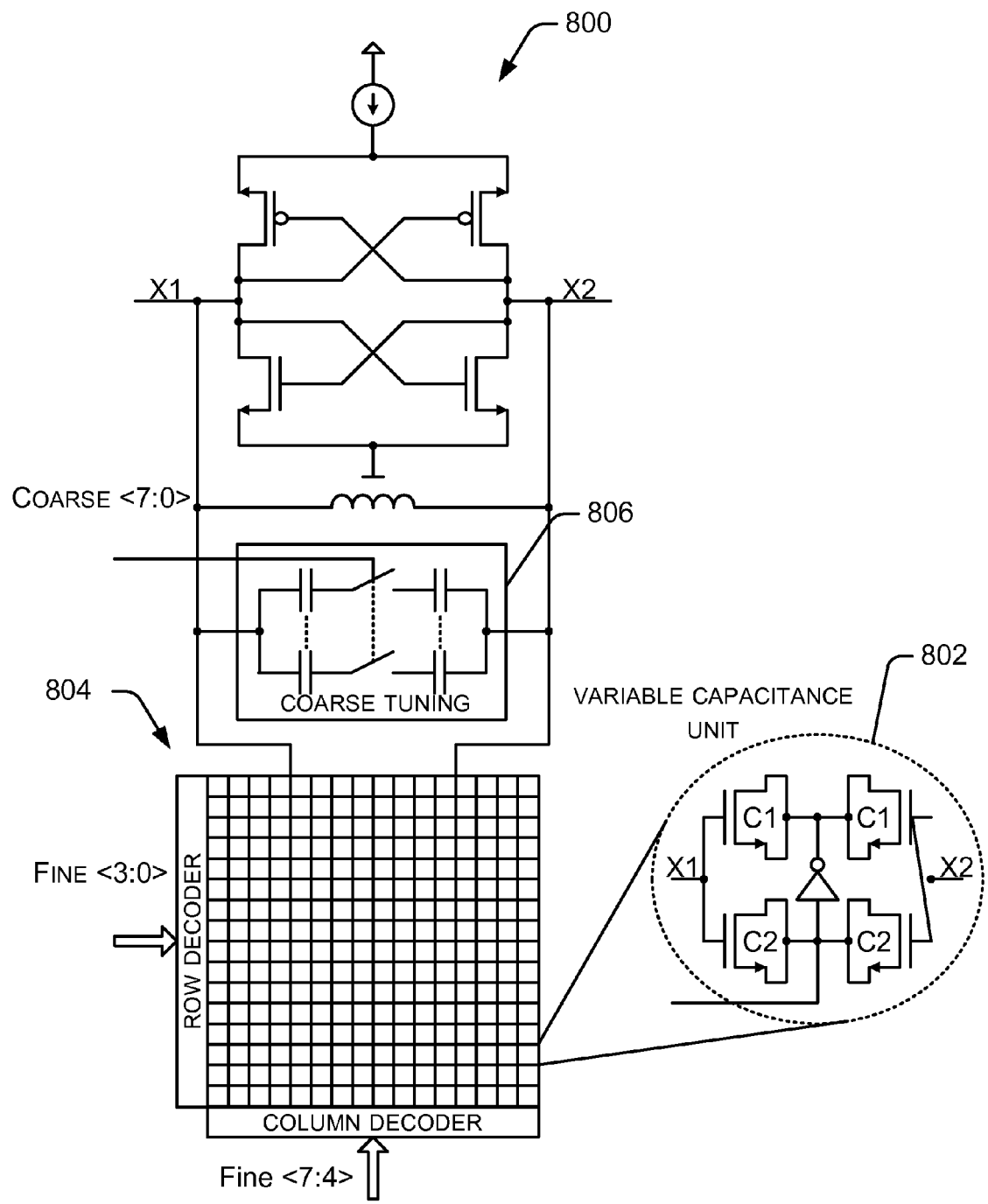
FIG. 8 shows the use of a variable capacitance unit in a DCO.

FIG. 8 illustrates the use of a variable capacitance unit in of a DCO, such as DCO 800. For example, the variable capacitance unit 802 is included as part of a varactor array 804 for fine tuning of the DCO 800. A differential variable capacitance unit 806, or other suitable device, may be used for coarse frequency tuning of the DCO 800.

Figure 9:
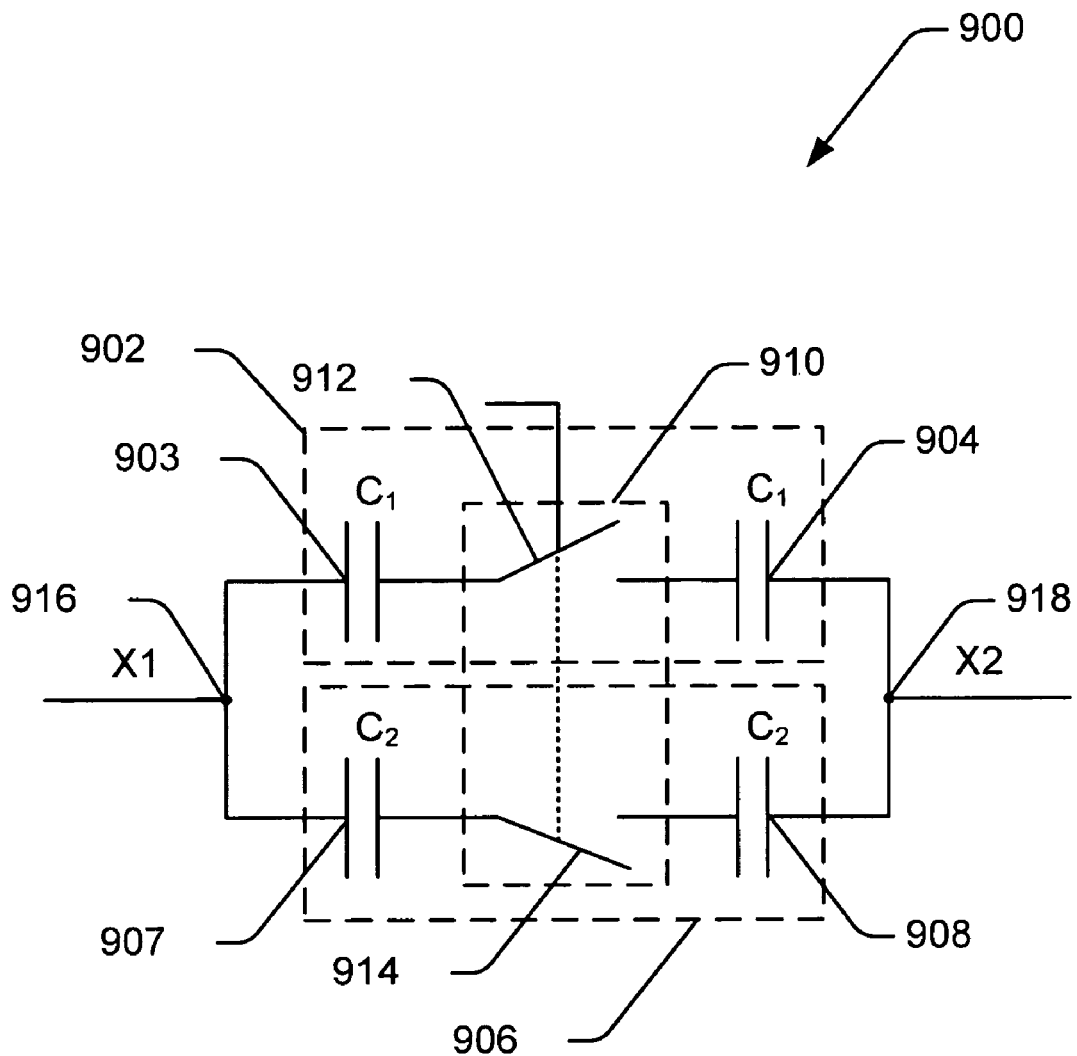
FIG. 9 shows a differential variable capacitance unit.

FIG. 9 shows the differential variable capacitance unit 900, which, similar to variable capacitance unit 806, may be used for coarse frequency tuning of a DCO, such as DCO 800. The first variable capacitance unit 900 includes a first capacitor component 902 that includes first and second capacitors 903 and 904 coupled to a second capacitor component 906 that includes first and second capacitors 907 and 908. The variable capacitance unit 900 also includes a switching component 910, which may include one or more control input terminals, such as switches 912, 914, and so forth, for activating, deactivating or otherwise switching the first and second capacitor components 902 and 906. The variable capacitance unit 900 has at least one output signal (e.g., X1, X2) corresponding to a total output capacitance of the variable capacitance unit 900. Control signals may be provided to switch component 910 to activate the first or second capacitor components 902 or 906 while deactivating the other of the capacitor components 902 or 906.

The maximum total output capacitance of the variable capacitance unit 900 is equal to about $C_2$ and the minimum total output capacitance of the variable capacitance unit is equal to about $C_1$. Thus, the difference ($\Delta C$) in the total output capacitance of the variable capacitance unit is $C_2-C_1$. According to one example, $\Delta C$ is less than the first capacitance $C_1$ or the second capacitance $C_2$ (i.e., $\Delta C=C_2-C_1<C_1$ (or $C_2$)) and may be is less than about 1 femtofarad (fF).

As shown in FIG. 9, the first capacitor component 902 includes first and second capacitors 903 and 904 and a first switch 912 with a control terminal. One terminal of the first capacitor 903 is connected to one terminal of the switch 912. The second terminal of the first capacitor 903 is connected to a first output terminal 916. One terminal of the second capacitor 904 is connected to the second terminal of the switch 912 and the second terminal of the second capacitor 904 is connected to a second output terminal 918. Likewise, the second capacitor component 906 includes first and second capacitors 907 and 908 and a second switch 914 with a control terminal. One terminal of the first capacitor 907 is connected to one terminal of the switch 914. The second terminal of the first capacitor 907 is connected to the first output terminal 916. One terminal of the second capacitor 908 is connected to the second terminal of the switch 914 and the second terminal of the second capacitor 908 is connected to the second output terminal 918. Thus, the first and second output terminals 916 and 918 are coupled to the first and second capacitor components 902 and 906. The first and second output terminals 916 and 918 may be further coupled to a DCO, such as DCO 800, to provide complementary signals corresponding to the total output capacitance of the variable capacitance unit 900.

Figure 10:
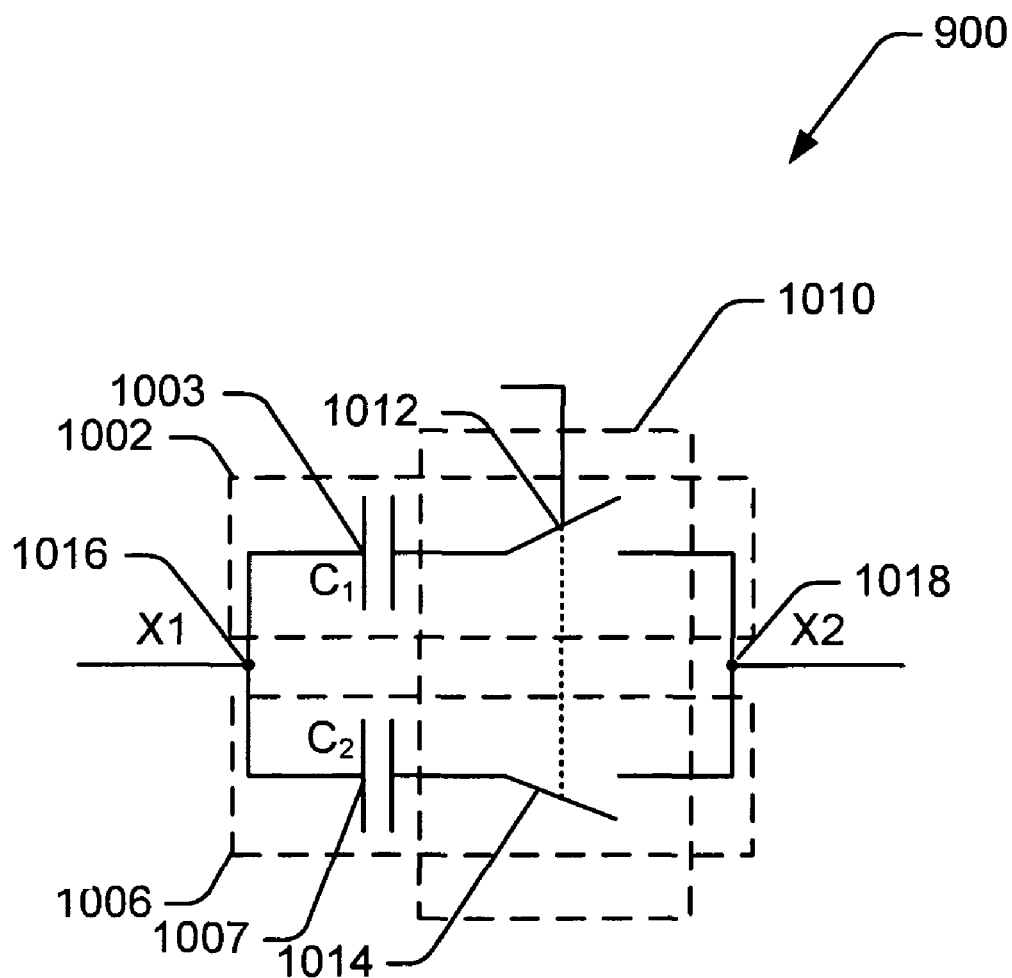
FIG. 10 shows a single ended variable capacitance unit.

FIG. 10 shows a single ended variable capacitance unit 1000, which, similar to variable capacitance unit 806, may be used for coarse frequency tuning of a DCO, such as DCO 800. The capacitance unit 1000 includes capacitor components 1002 and 1006 and a switching component 1010. The switching component 1010 may include one or more switches 1012, 1014, and so forth, for enabling, disabling, or otherwise switching the variable capacitance unit 1000.

As shown in FIG. 10, the first capacitor component 1002 includes a capacitor 1003 and a switch 1012 with a control terminal. One terminal of the capacitor 1003 is connected to one terminal of the switch 1003. The second terminal of the capacitor 1003 is connected to a first output terminal 1016. The second terminal of the switch 1012 is connected to a second output terminal 1018. Similarly, the second capacitor component 1004 includes a capacitor 1007 and a switch 1014 with a control terminal. One terminal of the capacitor 1007 is connected to one terminal of the switch 1014. The second terminal of the capacitor 1007 is connected to the first output terminal 1016 and the second terminal of the switch 1014 is connected to the second output terminal 1018. Thus, the first and second output terminals 1016 and 1018 are coupled to the first and second capacitor components 1002 and 1006. The first and second output terminals 1016 and 1018 may be further coupled to a DCO, such as DCO 800, to provide complementary signals corresponding to the total output capacitance of the variable capacitance unit 900.

According to a further implementation, the first capacitor component (e.g. 902, 1002) comprises at least one capacitor with a first length and a first width and the second capacitor component (e.g. 906, 1006) comprises at least one capacitor with a second length and a second width. The first length may be smaller than the second length. Additionally or alternatively, the first width may be smaller than the second width.

Figure 11:
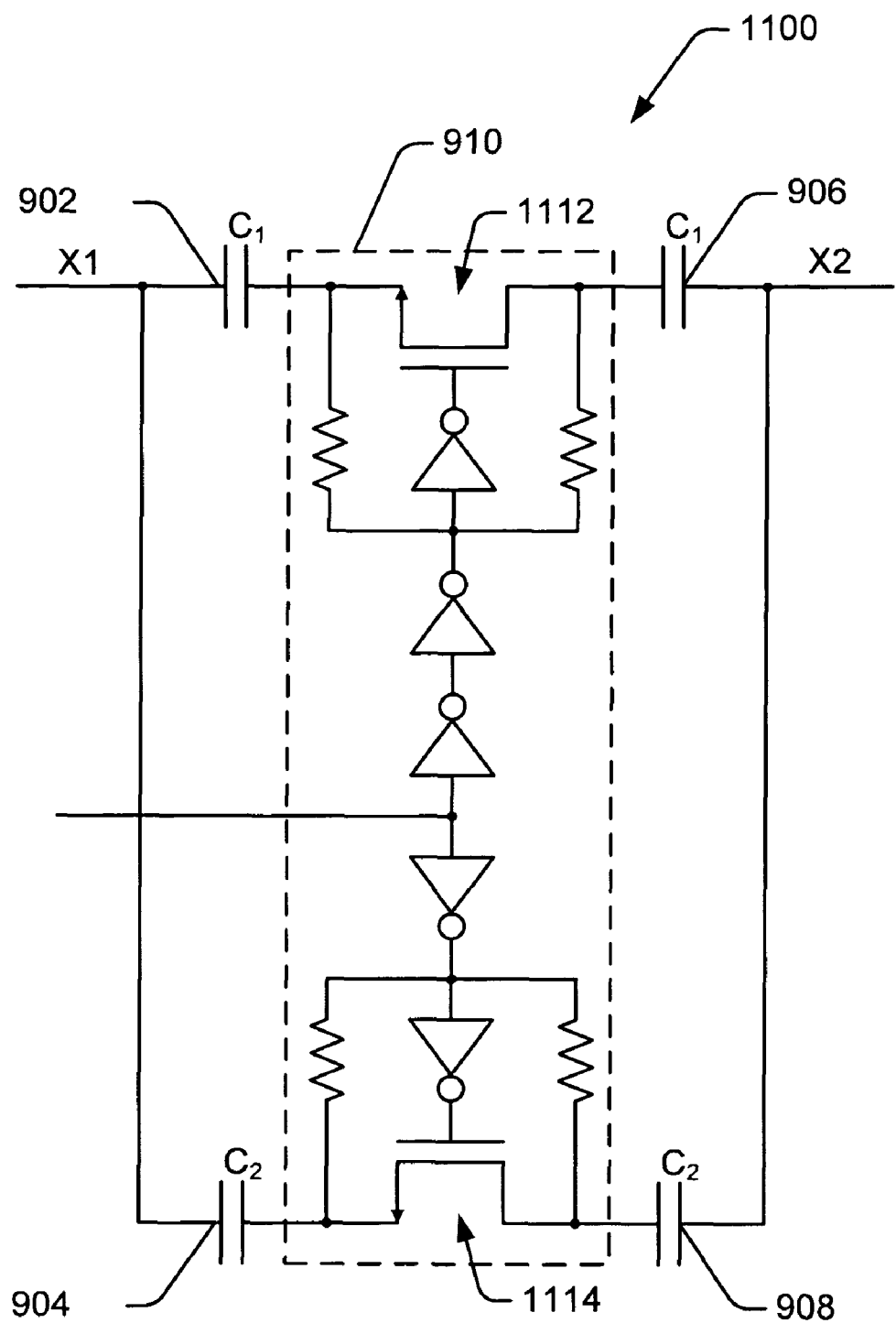
FIG. 11 shows on example of the variable capacitance unit of FIG. 9 implemented according to CMOS techniques.

FIG. 11 shows the differential variable capacitance unit of FIG. 9 implemented according to CMOS techniques. The variable capacitance unit 1100 includes capacitors 902, 904, 906, and 908 and a switching component 910. The switching component 910 may include transistor switches 1112 and 1114, which may be configured and controlled using resistors and other well known switch components.

Conclusion

For the purposes of this disclosure and the claims that follow, the terms "coupled" and "connected" may have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A variable capacitance unit comprising:
   a first varactor component with a first capacitance difference;
   a second varactor component with a second capacitance difference, the second varactor component being coupled to the first varactor component;
   a switching circuit including a plurality of series coupled inverters, the switching circuit to activate and deactivate the first and second varactor components; and at least one output signal corresponding to a total output capacitance of the variable capacitance unit, wherein a difference in the total output capacitance of the variable capacitance unit is less than the first capacitance difference or the second capacitance difference.

2. The variable capacitance unit of claim 1 wherein the first capacitance difference is expressed as $\Delta C_1 = C_{1max} - C_{1min}$, wherein $C_{1max}$ is the maximum capacitance of the first varactor component and $C_{1min}$ is the minimum capacitance of the first varactor component, the second capacitance difference is expressed as $\Delta C_2 = C_{2max} - C_{2min}$, wherein $C_{2max}$ is the maximum capacitance of the second varactor component and $C_{2min}$ is the minimum capacitance of the second varactor component, and the first capacitance difference ($\Delta C_1$) is less than the second capacitance difference ($\Delta C_2$).

3. The variable capacitance unit of claim 2 wherein the maximum total output capacitance of the variable capacitance unit is equal to about $(C_{2max} + C_{1min})$ and the minimum total output capacitance of the variable capacitance unit is equal to about $(C_{1max} + C_{2min})$ and the difference in the total output capacitance of the variable capacitance unit is $(C_{2max} + C_{1min}) - (C_{1max} + C_{2min})$.

4. The variable capacitance unit of claim 3 wherein the difference in the total output capacitance of the variable capacitance unit is less than about 1 attofarad (aF).

5. The variable capacitance unit of claim 1 wherein the switching circuit is operable to activate one of the first or second varactor components while deactivating the other of the varactor components.

6. The variable capacitance unit of claim 1 wherein the first varactor component comprises first and second varactors, the source terminals of the first and second varactors of the first varactor component being connected, the drain terminals of the first and second varactors of the first varactor component being connected, and wherein the second varactor component comprises first and second varactors, the source terminals of the first and second varactors of the second varactor component being connected, the drain terminals of the first and second varactors of the second varactor component being connected.

7. The variable capacitance unit of claim 6 wherein a gate of the first varactor of the first varactor component and a gate of the first varactor of the second varactor component are commonly coupled to a first output terminal and wherein a gate of the second varactor of the first varactor component and a gate of the second varactor of the second varactor component are commonly coupled to a second output terminal.

8. The variable capacitance unit of claim 7 wherein the first and second output terminals provide complementary signals corresponding to the total output capacitance of the variable capacitance system.

9. The variable capacitance unit of claim 8 wherein the first and second output terminals are coupled to a digitally-controlled oscillator (DCO).

10. The variable capacitance unit of claim 1 wherein the first varactor component comprises at least one varactor with a first length and a first width and the second varactor component comprises at least one varactor with a second length and a second width.

11. The variable capacitance unit of claim 10 wherein the first length is smaller than the second length.

12. The variable capacitance unit of claim 10 wherein the first width is smaller than the second width.

13. A wireless device comprising the variable capacitance unit of claim 1.

14. A system comprising:
a variable capacitance unit having a first varactor component with a first capacitance difference and a second varactor component with a second capacitance difference;
a switching circuit including a plurality of series coupled inverters, the switching circuit coupled to the variable capacitance unit to activate and deactivate the first and second varactor components; and
at least one output signal corresponding to a total output capacitance of the variable capacitance unit, wherein a difference in the total output capacitance of the variable capacitance unit is less than the first capacitance difference or the second capacitance difference.

15. The system of claim 14 further comprising a control input terminal coupled to the switching circuit, wherein the control input terminal is configurable to receive a mode signal for selecting one of the first or second varactor components for activation and the other of the varactor components for deactivation.

16. The system of claim 14 wherein the first capacitance difference is expressed as $\Delta C_1 = C_{1max} - C_{1min}$, wherein $C_{1max}$ is the maximum capacitance of the first varactor component and $C_{1min}$ is the minimum capacitance difference of the first varactor component, the second capacitance difference is expressed as $\Delta C_2 = C_{2max} - C_{2min}$, wherein $C_{2max}$ is the maximum capacitance of the second varactor component and $C_{2min}$ is the minimum capacitance of the second varactor component, and the first capacitance difference ($\Delta C_1$,) is less than the second capacitance difference ($\Delta C_2$).

17. The system of claim 16 wherein the maximum total output capacitance of the variable capacitance unit is equal to about $(C_{2max} + C_{1min})$ and the minimum total output capacitance of the variable capacitance unit is equal to about $(C_{1max} + C_{2min})$ and the difference in the total output capacitance of the variable capacitance unit is $(C_{2max} + C_{1min}) - (C_{1max} + C_{2min})$.

18. A digitally-controlled oscillator incorporating the system of claim 14.

19. A variable capacitance unit comprising:
a first capacitor component with a first capacitance $C_1$;
a second capacitor component with a second capacitance $C_2$, the second capacitor component being coupled to the first capacitor component;
control input terminals to receive control signals that activate and deactivate the first and second capacitor components; and
at least one output signal corresponding to a total output capacitance of the variable capacitance unit, wherein a difference in the total output capacitance of the variable capacitance unit is less than the first capacitance or the second capacitance
wherein the maximum total output capacitance of the variable capacitance unit is equal to about $C_2$ and the minimum total output capacitance of the variable capacitance unit is equal to about $C_1$ and the difference in the total output capacitance of the variable capacitance unit is $C_2 - C_1$.

20. The variable capacitance unit of claim 19 wherein $C_2 - C_1 < C_1$.

21. The variable capacitance unit of claim 19 wherein the difference in the total output capacitance of the variable capacitance unit is less than about 1 femtofarad (fF).

22. The variable capacitance unit of claim 19 wherein the control signals are operable to activate one of the first or second capacitor components while deactivating the other of the capacitor components.

23. The variable capacitance unit of claim 19 wherein:
the first capacitor component comprises first and second capacitors and a first switch with a control terminal, one terminal of the first capacitor is connected to one terminal of the switch, the second terminal of the first capacitor is connected to a first output terminal and one terminal of the second capacitor is connected to the second terminal of the switch and the second terminal of the second capacitor is connected to a second output terminal, and the second capacitor component comprises first and second capacitors and a second switch with a control terminal, one terminal of the first capacitor is connected to one terminal of the switch, the second terminal of the first capacitor is connected to the first output terminal and one terminal of the second capacitor is connected to the second terminal of the switch and the second terminal of the second capacitor is connected to the second output terminal.

24. The variable capacitance unit of claim 23 wherein the first and second output terminals provide complementary signals corresponding to the total output capacitance of the variable capacitance unit.

25. The variable capacitance unit of claim 23 wherein the first and second output terminals are coupled to a digitally-controlled oscillator (DCO).

26. The variable capacitance unit of claim 19 wherein:
the first capacitor component comprises a capacitor and a switch with a control terminal, one terminal of the capacitor is connected to one terminal of the switch, the second terminal of the capacitor is connected to a first output terminal and the second terminal of the switch is connected to a second output terminal, and wherein the second capacitor component comprises a capacitor and a switch with a control terminal, one terminal of the capacitor is connected to one terminal of the switch, the second terminal of the capacitor is connected to the first output terminal and the second terminal of the switch is connected to the second output terminal.

27. The variable capacitance unit of claim 26 wherein the first and second output terminals are coupled to a digitally-controlled oscillator (DCO).

28. The variable capacitance unit of claim 19 wherein the first capacitor component comprises at least one capacitor with a first length and a first width and the second capacitor component comprises at least one capacitor with a second length and a second width.

29. The variable capacitance unit of claim 28 wherein the first length is smaller than the second length.

30. The variable capacitance unit of claim 28 wherein the first width is smaller than the second width.

* * * * *